US008369388B2

(12) United States Patent
Hammerschmidt et al.

(10) Patent No.: US 8,369,388 B2
(45) Date of Patent: Feb. 5, 2013

(54) SINGLE-CHIP WIRELESS TRANCEIVER

(75) Inventors: Joachim S. Hammerschmidt, Mountain View, CA (US); Arya Reza Behzad, Poway, CA (US); Keith Andrews Carter, Rancho Palos Verdes, CA (US); Simeon Furrer, Mountain View, CA (US); Rohit Vijay Gaikwad, San Diego, CA (US); Jason Alexander Trachewsky, Menlo Park, CA (US); Amit Bagchi, Mountain View, CA (US); Rajendra Tushar Moorti, Mountain View, CA (US); Venkateswara Rao Kodavati, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 873 days.

(21) Appl. No.: 12/004,406

(22) Filed: Dec. 21, 2007

(65) Prior Publication Data

US 2008/0310487 A1 Dec. 18, 2008

Related U.S. Application Data

(60) Provisional application No. 60/929,160, filed on Jun. 15, 2007.

(51) Int. Cl.
*H04B 1/44* (2006.01)
(52) U.S. Cl. ........ 375/219; 375/354; 375/260; 375/295; 375/316
(58) Field of Classification Search .................. 375/219, 375/354, 295, 260, 316; 370/73, 276; 710/1; 455/78, 102, 73
See application file for complete search history.

(56) References Cited

U.S. PATENT DOCUMENTS

| | | | |
|---|---|---|---|
| 5,454,010 | A | 9/1995 | Leveque |
| 5,477,504 | A | 12/1995 | Hagerty |
| 5,740,526 | A | 4/1998 | Bonta et al. |
| 5,822,373 | A | 10/1998 | Addy |
| 6,307,883 | B1 | 10/2001 | Kanada et al. |
| 6,587,513 | B1 | 7/2003 | Ichihara |
| 6,728,517 | B2 | 4/2004 | Sugar et al. |

(Continued)

FOREIGN PATENT DOCUMENTS

| | | |
|---|---|---|
| CN | 1647404 | 7/2005 |
| WO | WO 03/090370 A1 | 10/2003 |

OTHER PUBLICATIONS

Intensi-fi Product Brief: Draft-802.11n Product Family, Broadcom Corporation Intensi-fi-PB03-R, Jun. 27, 2008, 2 pages.

(Continued)

*Primary Examiner* — Shuwang Liu
*Assistant Examiner* — Helene Tayong
(74) *Attorney, Agent, or Firm* — Sterne, Kessler, Goldstein & Fox P.L.L.C.

(57) ABSTRACT

Embodiments of a wireless transceiver are provided. Embodiments can be used in multiple-input-multiple-output (MIMO) wireless transceivers. In an embodiment, radio control signal bundles are provided as direct parallel interconnects between digital signal processing modules and the radio module of the wireless transceiver to enable a precise low-latency control of radio functions. In another embodiment, a separate physical line is provided to control each radio setting of the radio module, thereby enabling simultaneous real-time control of any number of radio settings. In a further embodiment, the various digital and analog components of the wireless transceiver are integrated within a single chip of the same process technology.

33 Claims, 4 Drawing Sheets

U.S. PATENT DOCUMENTS

| | | |
|---|---|---|
| 6,862,315 B1 | 3/2005 | Garg et al. |
| 7,035,345 B2 | 4/2006 | Jeckeln et al. |
| 7,095,994 B1 | 8/2006 | Aytur et al. |
| 7,161,987 B2 | 1/2007 | Webster et al. |
| 7,177,374 B2 | 2/2007 | Gaikwad et al. |
| 7,183,847 B2 | 2/2007 | Suzuki et al. |
| 7,233,773 B2 | 6/2007 | Hansen et al. |
| 7,259,630 B2 | 8/2007 | Bachman et al. |
| 7,269,430 B2 | 9/2007 | Moorti et al. |
| 7,279,972 B2 | 10/2007 | Smithson |
| 7,321,264 B2 | 1/2008 | Kokkeler |
| 7,340,265 B2 | 3/2008 | Husted et al. |
| 7,386,063 B1 | 6/2008 | Husted |
| 7,403,573 B2 | 7/2008 | DeBruyn et al. |
| 7,414,470 B2 | 8/2008 | Okazaki |
| 7,450,533 B2 | 11/2008 | Aoki et al. |
| 7,480,234 B1 | 1/2009 | Hart et al. |
| 7,483,802 B2 | 1/2009 | Wood |
| 7,577,413 B2 | 8/2009 | He et al. |
| 7,620,373 B2 | 11/2009 | Cole et al. |
| 7,646,876 B2 | 1/2010 | Chu et al. |
| 7,822,406 B2 | 10/2010 | Lee et al. |
| 7,881,390 B2 | 2/2011 | Sadowsky et al. |
| 7,881,402 B2 | 2/2011 | Gao et al. |
| 7,890,061 B2 | 2/2011 | Kasher et al. |
| 7,983,631 B2* | 7/2011 | Rofougaran .................... 455/91 |
| 2003/0203743 A1* | 10/2003 | Sugar et al. ................. 455/550.1 |
| 2004/0121753 A1* | 6/2004 | Sugar et al. .................... 455/333 |
| 2004/0264600 A1 | 12/2004 | Kao et al. |
| 2005/0064892 A1* | 3/2005 | Cavin .......................... 455/550.1 |
| 2005/0113120 A1 | 5/2005 | Rappaport et al. |
| 2005/0117660 A1* | 6/2005 | Vialle et al. ................... 375/299 |
| 2005/0243942 A1* | 11/2005 | Sawai ............................ 375/267 |
| 2006/0084402 A1 | 4/2006 | Oshima et al. |
| 2006/0146869 A1 | 7/2006 | Zhang et al. |
| 2006/0182074 A1 | 8/2006 | Kubler et al. |
| 2006/0182168 A1 | 8/2006 | Wang et al. |
| 2006/0198477 A1 | 9/2006 | Moorti et al. |
| 2006/0223483 A1 | 10/2006 | Behzad |
| 2006/0229029 A1* | 10/2006 | Waltho et al. ................... 455/73 |
| 2006/0246855 A1* | 11/2006 | Kato et al. .................... 455/102 |
| 2006/0285478 A1 | 12/2006 | Gaikwad et al. |
| 2007/0002878 A1 | 1/2007 | Moorti et al. |
| 2007/0002963 A1* | 1/2007 | Pedersen et al. ............. 375/267 |
| 2007/0002981 A1 | 1/2007 | Gaikwad et al. |
| 2007/0004372 A1* | 1/2007 | Adams et al. ................. 455/333 |
| 2007/0019749 A1 | 1/2007 | Gaikwad et al. |
| 2007/0019750 A1 | 1/2007 | Gaikwad et al. |
| 2007/0060162 A1 | 3/2007 | Xhafa et al. |
| 2007/0064740 A1 | 3/2007 | Waxman |
| 2007/0105587 A1* | 5/2007 | Lu ............................... 455/552.1 |
| 2007/0110197 A1 | 5/2007 | Bagchi et al. |
| 2007/0202749 A1* | 8/2007 | Bhat et al. ..................... 439/630 |
| 2007/0218851 A1 | 9/2007 | Soe et al. |
| 2007/0224935 A1 | 9/2007 | Waxman |
| 2007/0230328 A1* | 10/2007 | Saitou .......................... 370/210 |
| 2008/0013654 A1 | 1/2008 | Rick et al. |
| 2008/0062929 A1* | 3/2008 | Leonidov et al. ............. 370/331 |
| 2008/0095260 A1* | 4/2008 | Vaidyanathan ............... 375/267 |
| 2008/0101495 A1 | 5/2008 | Gaikwad |
| 2008/0101496 A1 | 5/2008 | Gaikwad |
| 2008/0101497 A1 | 5/2008 | Gaikwad et al. |
| 2008/0118013 A1* | 5/2008 | Vis et al. ....................... 375/354 |
| 2008/0139156 A1 | 6/2008 | Behzad et al. |
| 2008/0159442 A1 | 7/2008 | Tanabe et al. |
| 2008/0293368 A1 | 11/2008 | Desai et al. |
| 2008/0293447 A1* | 11/2008 | Rofougaran ............... 455/553.1 |
| 2008/0309405 A1 | 12/2008 | Young |
| 2008/0310336 A1 | 12/2008 | Gaikwad |
| 2008/0310557 A1 | 12/2008 | Gaikwad |
| 2008/0310558 A1 | 12/2008 | Gaikwad |
| 2008/0310559 A1 | 12/2008 | Gaikwad |
| 2009/0168650 A1* | 7/2009 | Kesselman .................... 370/235 |
| 2009/0325507 A1* | 12/2009 | Trachewsky et al. ........... 455/73 |
| 2010/0137024 A1 | 6/2010 | Maguire |
| 2010/0208852 A1* | 8/2010 | Feher ............................ 375/343 |
| 2011/0310938 A1* | 12/2011 | Trachewsky et al. ......... 375/219 |
| 2012/0077447 A1* | 3/2012 | Rofougaran .................... 455/73 |

OTHER PUBLICATIONS

IEEE Standard 802.11 a-1999, part 11, IEEE, 1999, pp. 1-90.
Bibliographic sheet for CN 164704(a), Jul. 27, 2005, 1 page.
Final Office Action mailed on Mar. 15, 2010, in U.S. Appl. No. 12/139,634, inventor Young, filed Jun. 16, 2008; 5 pages.
Final Office Action mailed on Nov. 27, 2009, in U.S. Appl. No. 12/139,634, inventor Young, filed Jun. 16, 2008; 4 pages.
Non-Final Office Action mailed on Apr. 1, 2011, in U.S. Appl. No. 12/213,172, inventor Gaikwad, filed Jun. 16, 2008; 17 pages.
Non-Final Office Action mailed on Apr. 28, 2011, in U.S. Appl. No. 12/213,179, inventor Gaikwad, filed Jun. 16, 2008; 7 pages.
Non-Final Office Action mailed on Apr. 5, 2011, in U.S. Appl. No. 12/213,176, inventor Gaikwad, filed Jun. 16, 2008; 13 pages.
Non-Final Office Action mailed on Jul. 31, 2009, in U.S. Appl. No. 12/139,634, inventor Young, filed Jun. 16, 2008; 4 pages.
Non-Final Office Action mailed on May 4, 2011, in U.S. Appl. No. 12/139,634, inventor Young, filed Jun. 16, 2008; 5 pages.
Non-Final Office Action mailed on Sep. 26, 2011, in U.S. Appl. No. 12/213,175, inventor Gaikwad, filed Jun. 16, 2008; 14 pages.
Non-Final Office Action mailed on Sep. 8, 2011, in U.S. Appl. No. 12/213,172, inventor Gaikwad, filed Jun. 16, 2008; 17 pages.
Notice of Allowance mailed on Nov. 25, 2011, in U.S. Appl. No. 12/139,634, inventor Young, filed Jun. 16, 2008; 7 pages.
Notice of Allowance mailed on Oct. 20, 2011, in U.S. Appl. No. 12/213,179, inventor Gaikwad, filed Jun. 16, 2008; 10 pages.
Supplemental Notice of Allowance mailed on Dec. 23, 2011, in U.S. Appl. No. 12/213,179, inventor Gaikwad, filed Jun. 16, 2008; 7 pages.

* cited by examiner

SINGLE-CHIP WIRELESS TRANCEIVER

CROSS-REFERENCE TO RELATED APPLICATIONS

The present application claims the benefit of U.S. Provisional Patent Application No. 60/929,160, filed Jun. 15, 2007, which is incorporated herein by reference in its entirety.

BACKGROUND OF THE INVENTION

1. Field of the Invention

The present invention relates generally to wireless communications, and more particularly to a wireless transceiver.

2. Background Art

Multiple-input-multiple-output (MIMO) is a wireless communications technology that simultaneously uses multiple spatial sub-channels formed between multiple transmit antennas and multiple receive antennas to transmit signals between wireless transceivers.

Accordingly, precise real-time control of radio settings in the wireless transceivers is needed to efficiently receive and recombine received signals into information signals. For example, real-time control is needed of gain stages, filter bandwidths, and power-up/down functions of radio components of the wireless transceiver.

Conventional wireless transceivers provide a degraded ability of real-time radio control. This degradation becomes even more stringent when more than two transmitter and/or receiver radio units are used in the wireless transceiver.

Therefore, an improved approach to the real-time control of radio components in wireless transceivers, and particularly in MIMO wireless transceivers, is needed.

BRIEF SUMMARY OF THE INVENTION

Embodiments of a wireless transceiver are provided herein. Embodiments can be used in multiple-input-multiple-output (MIMO) wireless transceivers. In an embodiment, radio control signal bundles are provided as direct parallel interconnects between digital signal processing modules and the radio module of the wireless transceiver to enable a precise low-latency control of radio functions. In another embodiment, a separate physical line is provided to control each radio setting of the radio module, thereby enabling simultaneous real-time control of any number of radio settings. In a further embodiment, the various digital and analog components of the wireless transceiver are integrated within a single chip of the same process technology.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. Generally, the drawing in which an element first appears is typically indicated by the leftmost digit(s) in the corresponding reference number.

DETAILED DESCRIPTION OF EMBODIMENT(S)

Figure 1:
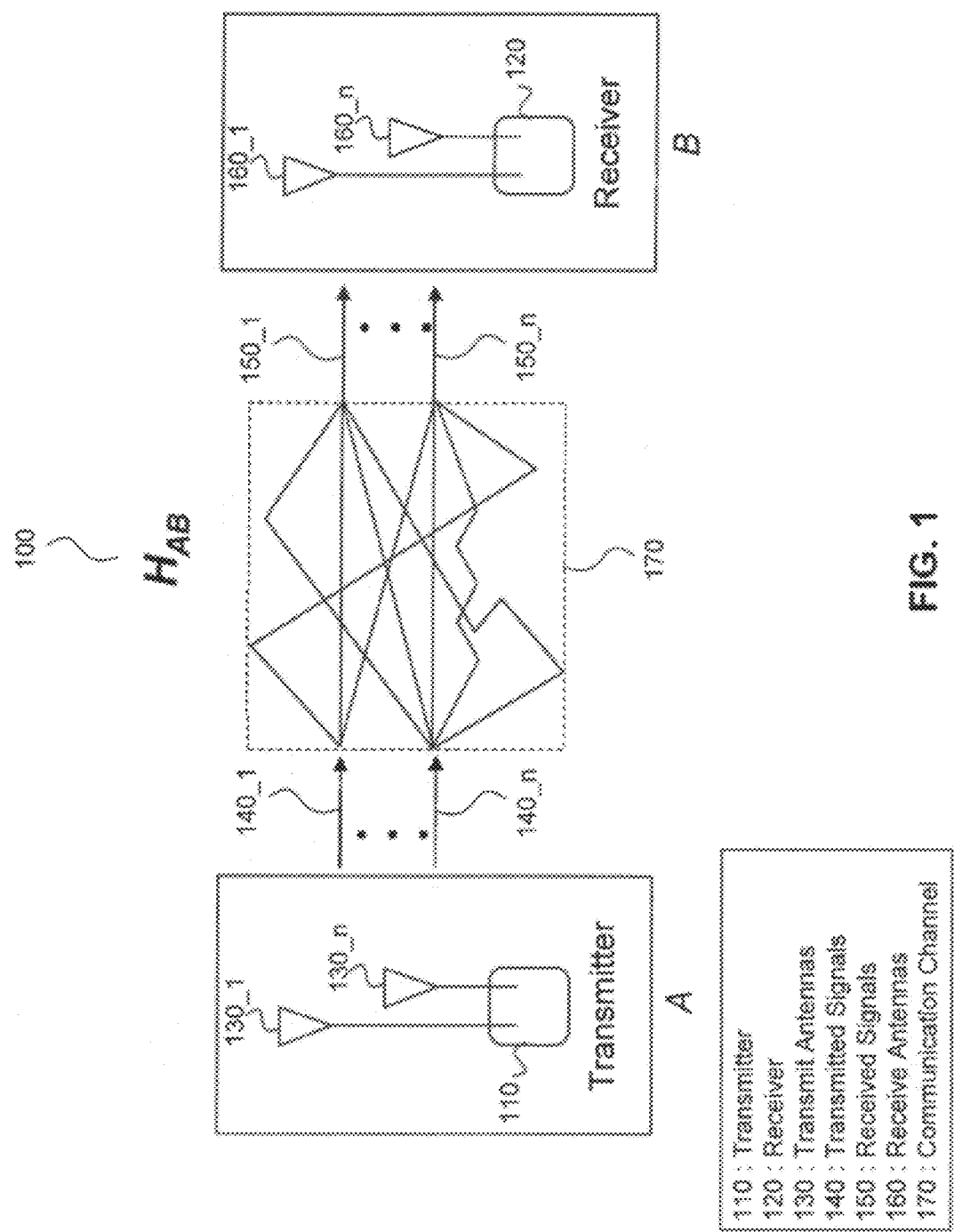
FIG. 1 illustrates an example multiple-input-multiple-output (MIMO) communication system.

FIG. 1 illustrates an example multiple-input multiple-output (MIMO) communication system 100. Communication system 100 includes transceivers A and B and a communication channel 170.

Transceiver A includes a transmitter 110. Transceiver A may also include a receiver (not shown). Transmitter 110 includes multiple transmit antennas 130-$\{1, \ldots, n\}$. Transceiver B includes a receiver 120. Transceiver B may also include a transmitter (not shown). Receiver 120 includes multiple receive antennas 160-$\{1, \ldots, m\}$. The number of transmit antennas (n) of transmitter 110 and the number of receive antennas (m) of receiver 120 may or may not be equal.

Communication channel 170 represents a MIMO channel. Accordingly, communication channel 170 includes multiple spatial sub-channels formed between multiple transmit antennas 130-$\{1, \ldots, n\}$ and multiple receive antennas 160-$\{1, \ldots, m\}$. Typically, the number of spatial sub-channels comprised in a MIMO communication channel is related to a channel matrix H of the communication channel, which associates a complex gain (amplitude attenuation factor and a phase shift) with each spatial sub-channel.

Referring to the example of FIG. 1, $H_{AB}$ represents the channel matrix from transmitter 110 to receiver 120 of communication channel 170.

Still referring to FIG. 1, signals 140-$\{1, \ldots, n\}$ represent signals transmitted by respective transmit antennas 130-$\{1, \ldots, n\}$ of transmitter 110. Signals 140-$\{1, \ldots, n\}$ may be transmitted with equal or different transmit power levels. As illustrated in FIG. 1, signals 140-$\{1, \ldots, n\}$ propagate in different propagation paths from transmitter 110 to receiver 120 and thus experience different channel effects. At receiver 120, signals 140-$\{1, \ldots, n\}$ recombine to generate received signals 150-$\{1, \ldots, m\}$ at respective receive antennas 160-$\{1, \ldots, m\}$. Received signals 150-$\{1, \ldots, m\}$ may be received at equal or different power levels. Further, received signals 150-$\{1, \ldots, m\}$ may be received at equal or different instants of time.

Figure 2:
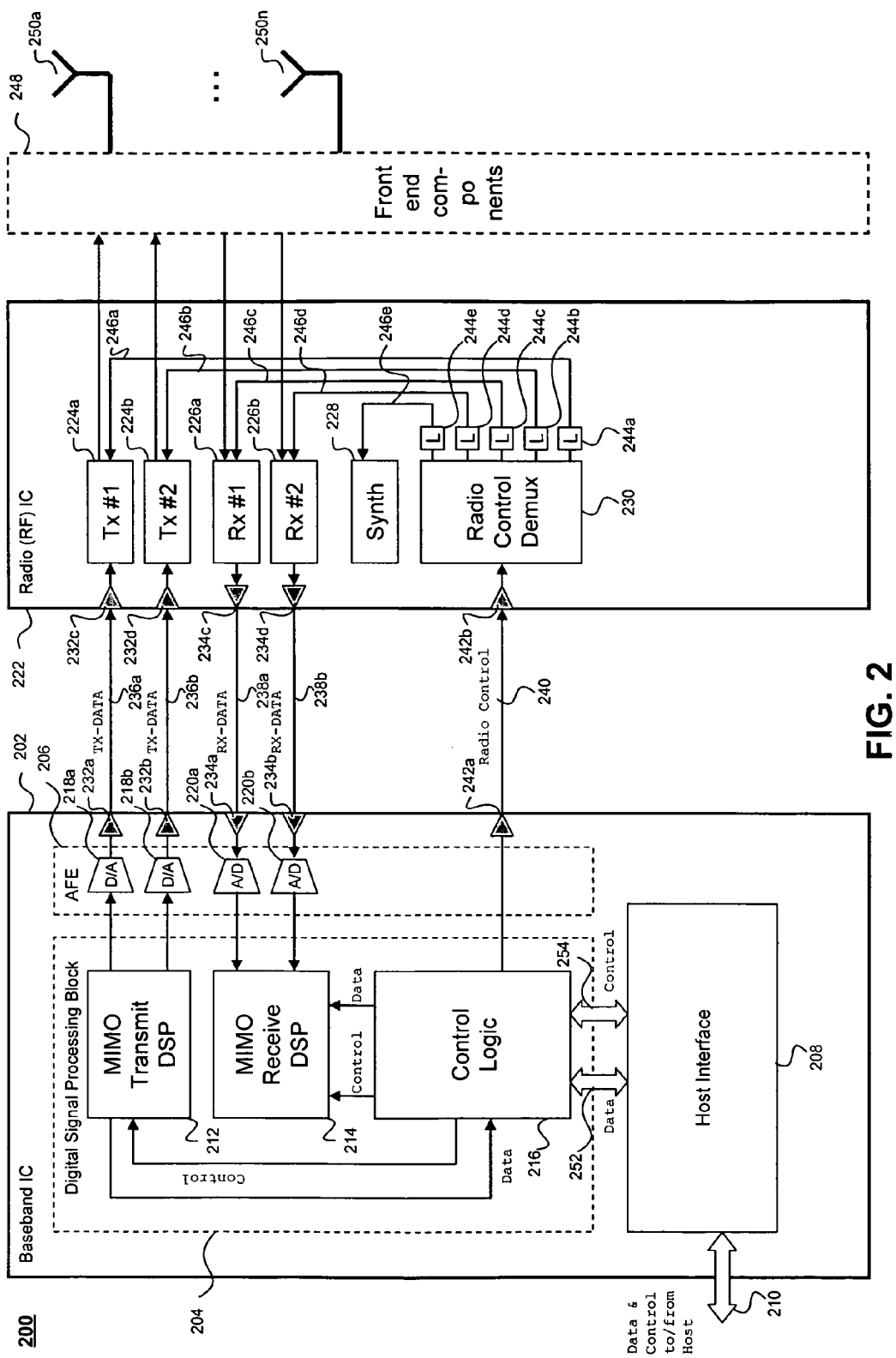
FIG. 2 illustrates an example MIMO wireless transceiver.

FIG. 2 illustrates an example MIMO wireless transceiver 200. Wireless transceiver 200 can be used in a wireless local area network (WLAN) environment, such as 802.11n.

Wireless transceiver 200 includes a baseband integrated circuit (IC) 202, a radio IC 222, front end components 248, and a plurality of antennas 250a-n.

Baseband IC 202 includes a Digital Signal Processing (DSP) module 204, an Analog Front End (AFE) module 206, and a Host Interface 208.

DSP module 204 includes a MIMO Transmit module 212, a MIMO receive module 214, and a control logic module 216. Control and Data signals connect control logic module 216 with each of MIMO Transmit module 212 and MIMO receive module 214.

AFE module 206 includes a plurality of Digital-to-Analog Converters (DACs) 218a-b and Analog-to-Digital Converters (ADCs) 220a-b. For the ease of illustration, AFE module 206 is illustrated with only two DACs and two ADCs. However, as would be understood by a person skilled in the art based on the teachings herein, AFE module 206 can include any number of DACs and ADCs.

Host Interface 208 is an interface between a host processor (not shown) and DSP module 204. As such, host interface 208 communicates via a data and control bus 210 with the host processor and via data bus 252 and control bus 254 with control logic module 216. Typically, host interface 208 is a multi-GHz interface with a clock speed comparable to that of the processor and much higher than that of DSP module 204. In another embodiment, host interface 208 can include an embedded Host Processor instead of merely being an interface to a host processor located outside of the chip. A host processor generally carries out higher layer protocol tasks, including tasks related to medium access control (MAC), rate control (adaptation of the transmission speed parameters over the air), TCP/IP, and radio calibration control.

Radio IC 222 includes a plurality of transmitter units 224a-b, a plurality of receive units 226a-b, a synthesizer module 228, and a radio control de-multiplexer 230. For the ease of illustration, Radio IC 222 is illustrated with only two transmitter units and two receiver units. However, as would be understood by a person skilled in the art based on the teachings herein, radio IC 222 can include any number of transmitter units and receiver units.

Transmitter units 224a-b each includes at least one of (a) one or more frequency up-conversion stages; (b) one or more variable gain amplification stages; (c) one or more variable bandwidth filtering stages; and (d) circuitry to selectively enable/disable the frequency up-conversion, amplification, and filtering stages. Similarly, receiver units 226a-b each includes at least one of (e) one or more frequency down-conversion stages; (f) one or more variable gain amplification stages; (g) one or more variable bandwidth filtering stages; and (h) circuitry to selectively enable/disable said frequency down-conversion, amplification, and filtering stages.

Synthesizer module 228 generates and provides frequency conversion signals to the frequency up-conversion stages of transmitter units 224a-b and the frequency down-conversion stages of receiver units 226a-b.

In the transmit mode of wireless transceiver 200, MIMO Transmit module 212 generates digital streams from received information. The digital streams are converted by DACs 218a-b into transmit analog signals, which are forwarded over circuit lines 236a-b to transmitter units 224a-b of radio IC 222. In the receive mode, analog signals are received by receive units 226a-b of radio IC 222 and are forwarded over circuit lines 238a-b to baseband IC 202. At baseband IC 202, ADCs 220a-b convert the analog signals to digital signals, which are then transferred to MIMO Receive module 214.

Circuit lines 236a-b and 238a-b are printed lines over the circuit board where baseband IC 202 and radio IC 222 are co-located. As such, driver-matching circuitry are needed at the ends of circuit lines 236 or 238 to generate sufficient driving power to forward the analog signals with low noise, low interference, and low latency between radio IC 222 and baseband IC 202. Driver-matching circuitry are illustrated using reference numerals 232a-d and 234a-d over circuit lines 236 and 238, respectively. Generally, since baseband IC 202 and radio IC 222 are based on different process technologies (e.g., CMOS versus SiGe), the driver-matching circuitry found at the ends of circuit lines 236 and 238 may also include voltage conversion devices to ensure reliable signal transfer.

It is noted that in conventional transceivers, which use a complex signal representation of bandpass signals, each transmit signal driven between baseband IC 202 and a respective transmitter unit 224 of radio IC 222 includes four circuit lines, with two differential circuit lines for each of the real part (In-phase) and the imaginary part (Quadrature phase) of the complex signal. Similarly, receive signals driven between receive units 226 and baseband IC 202 each includes four circuit lines.

In addition to data signals, radio control signals are also sent between baseband IC 202 and radio IC 222. This is illustrated using radio control signal 240, which is used to transmit control information between baseband IC 202 and the radio components of radio IC 222, including transmitter units 224a-b, receiver units 226a-b, and synthesizer module 228. As with transmit and receive data signals 236a-b and 238a-b, driver-matching circuitry 242a-b are used at both ends of control signal 240.

In wireless transceiver 200, radio control information transmitted over radio control signal 240 is received by radio control de-multiplexer 230 of radio IC 222. Radio control de-multiplexer 230 forwards the received control information to its intended recipient among transmitter units 224a-b, receiver units 226a-b, and synthesizer 228 via signal lines 246a-e. As such, latches 244a-e are needed to maintain the state of control signal 240 for a given radio unit, while radio control signal 240 can be used to transmit control information for another radio unit in a subsequent time slot.

Typically, radio transceivers that support high data rates require a tight control of radio settings, including control of amplifier gains, filter bandwidths, and power-up/down events.

For example, transmit chains of radio transceivers often have multiple gain stages, whose gains need to be carefully set to achieve high signal quality and to meet transmit power requirements. Similarly, receive chains also have multiple gain stages that need to be adjusted in order to reliably receive incoming signals with minimal signal integrity loss. Further, the control of the transmit and receive gains need to occur in real-time and with very small latency (e.g., 100 nanoseconds or less) in order to timely complete time-critical events. For example, in the case of an OFDM frame according to 802.11a or 802.11n, the frame needs to be carrier-detected (or carrier-sensed, CRS) and all receive gains have to be optimally adjusted using gain-control steps (GCT) within an overall time period of 6-8 microseconds.

In addition to gain control, real-time filter bandwidth control is also needed. For example, 802.11n is characterized by a complex signaling structure that specifies different signaling bandwidths (e.g., 20 and 40 MHz) and that requires backward compatibility with standards such as 802.11, 802.11a, 802.11b, and 802.11g. As such, depending on the signal structure that is transmitted or received, filtering parameters have to be adjusted in real-time to adjust the transceiver for optimal signal transmission or reception.

Similarly, real-time control is needed of power-up/down functions of the radio components to reduce power consumption and potential interference between the components.

Accordingly, a high degree of direct controllability through circuit lines between baseband IC 202 and radio IC 222 is desired to achieve the above described real-time controls. This, however, is both challenging and cost inefficient to implement in wireless transceiver designs such as wireless transceiver 200.

In one aspect, a large number of pins and circuit lines between baseband IC 202 and radio IC 222 will be needed. This is particularly true in the case of MIMO transceivers, which include large numbers of transmitter and receiver units. As such, with driver-matching circuitry needed for each circuit line, the transceiver design becomes high in cost and power consumption. In addition, signal quality can be impacted. For example, due to the inductive and/or capacitive characteristics of circuit lines, the driver-matching circuitry can cause an increase in the latency of the real-time control signals. Further, the driver-matching circuitry cause an increase in heat generation in the radio IC, particularly when a power amplifier (PA) is integrated within the radio IC, leading to an increase in thermal noise and distortion and interfering with the integrity of incoming and/or outgoing signals.

All these factors result in a limited number of possible interconnects between baseband IC 202 and radio IC 222, which causes a time-multiplexed approach to the control of radio components of radio IC 222. This degrades the ability of baseband IC 202 to control in real-time radio components of radio IC 222. For example, due to the use of fewer than desired interconnects between baseband IC 202 and radio IC 222, the number of gain stages that can be individually adjusted at any given time is limited. Similarly, lower flexibility in real-time bandwidth adjustment and in the real-time control of power-up/down functions of radio components is achieved.

The degradation in the real-time control of radio components of radio IC 222 becomes even more stringent when more than two transmitter and/or receiver radio units are used. For example, in conventional transceivers, the number of desired interconnects increases proportionally as a function of the number of transmitter and receiver units in radio IC 222 at the rate of 4*(N+M), where N is the number of transmitter units and M is the number of receiver units of radio IC 222.

Accordingly, in practice, only a limited number of radio settings can be adjusted in real-time at any given time and a time-multiplexed approach to real-time control, as illustrated in wireless transceiver 200 using radio control de-multiplexer 230, is used. These drawbacks result in signal integrity-deterioration through delayed signaling and increased impairments due to higher thermal noise and/or distortion, which is particularly disadvantageous in the context of MIMO systems, which require higher signal-to-noise-and-distortion ratios and signal-to-interference ratios for proper reconstruction of transmitted data sequences.

Therefore, an improved approach to the real-time control of radio components in wireless transceivers, and particularly in MIMO wireless transceivers, is needed.

Figure 3:
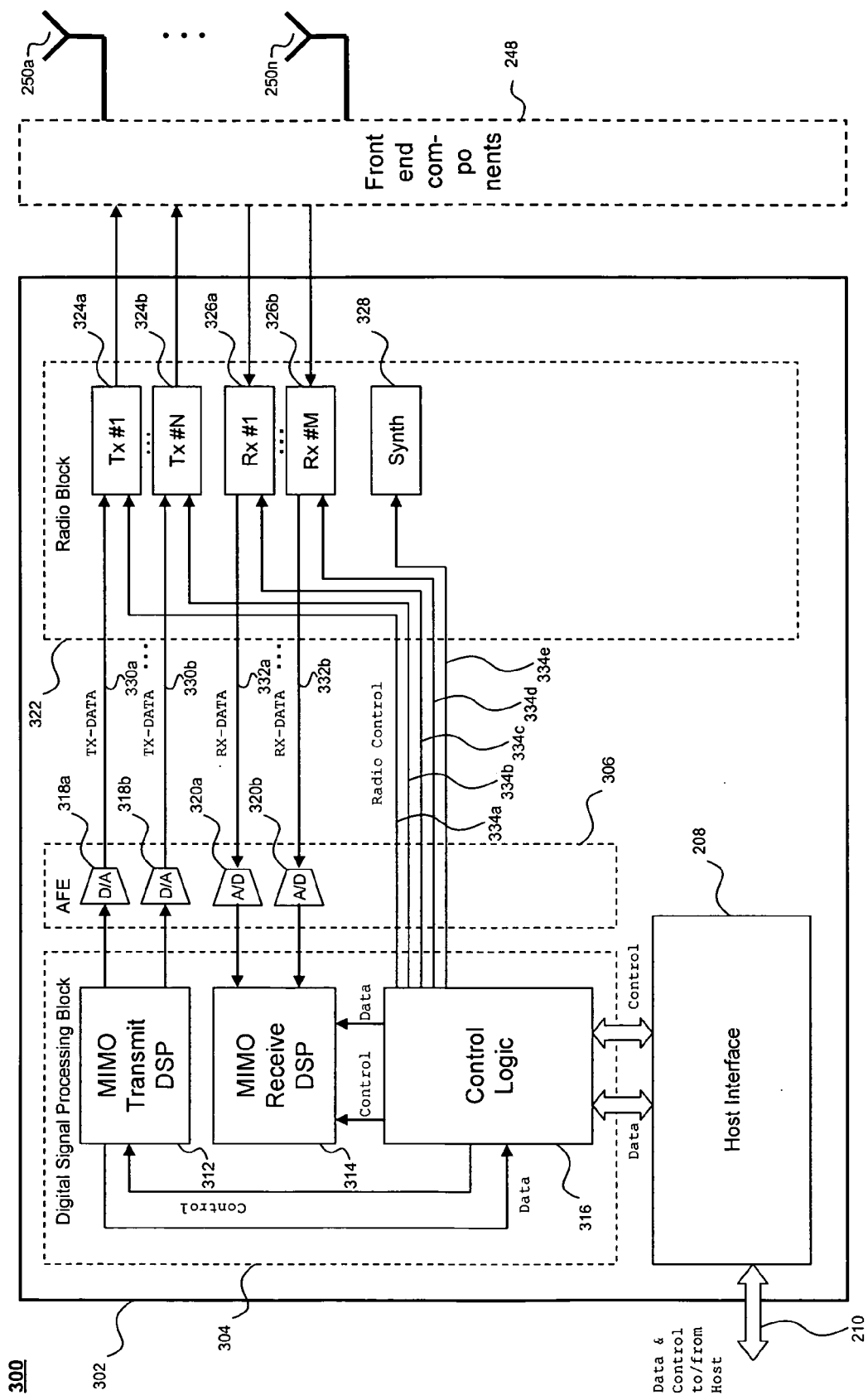
FIG. 3 illustrates another example MIMO wireless transceiver.

FIG. 3 illustrates another example MIMO wireless transceiver 300. Wireless transceiver 300 includes a MIMO integrated circuit (IC) 302, front end components 248, and a plurality of antennas 250a-n.

MIMO IC 302 includes a MIMO Digital Signal Processing (DSP) module 304, a MIMO radio module 322, and a host processor interface 208, all integrated within a single integrated circuit using the same process technology. In an embodiment, a CMOS process technology is used.

MIMO DSP module 304 includes a MIMO Transmit module 312, a MIMO receive module 314, and a control logic module 316. MIMO Transmit module 312, MIMO Receive module 314, and control logic module 316 are structurally and functionally similar to MIMO Transmit module 212, MIMO Receive module 214, and control logic module 216, respectively, of wireless transceiver 200.

MIMO radio module 322 includes a plurality of transmitter units 324a-b, a plurality of receiver units 326a-b, and a synthesizer module 328. Transmitter units 324a-b, receiver units 326a-b, and synthesizer module 328 are structurally and functionally similar to transmitter units 224a-b, receiver units 226a-b, and synthesizer module 228, respectively, of wireless transceiver 200. In an embodiment, transmitter units 324a-b each includes an integrated power amplifier (PA) stage.

As in wireless transceiver 200, an Analog Front End (AFE) module 306, including a plurality of Digital-to-Analog Converters (DACs) 318a-b and Analog-to-Digital Converters (ADCs) 320a-b, is used to convert from digital to analog (from analog to digital) transmit data signals 330a-b (receive data signals 332a-b) between MIMO DSP module 304 and MIMO radio module 322.

MIMO IC 302 further includes a plurality of radio control signal bundles 334a-e that couple control logic module 316 with respective ones of transmitter units 324a-b, receiver units 326a-b, and synthesizer module 328. In an embodiment, radio control signal bundles 334a-e include a plurality of transmit radio control signal bundles 334a-b, a plurality of receive radio control signal bundles 334c-d, and a synthesizer radio control signal bundle 334e. Each of transmit radio control signal bundles 334a-b includes control signals to control respective stages (e.g., frequency conversion stages, gain, etc.) of a corresponding transmitter unit of MIMO radio module 322. Similarly, each of receive radio control signal bundles 334c-d includes control signals to control respective stages of a corresponding receiver unit of MIMO radio module 322. Synthesizer radio control signal bundle 334e includes control signals to control respective stages of synthesizer module 328.

In an embodiment, radio control signal bundles 334a-e are direct parallel interconnects between control logic module 316 and MIMO radio module 322, providing a separate physical line for each radio setting of each transmitter and receiver unit. As such, radio control signal bundles 334a-e enable MIMO DSP module 304 to simultaneously control in real-time any one of transmitter units 324a-b, receiver units 326a-b, and synthesizer module 328. Furthermore, the higher efficiency of these direct interconnects enable a large number of interconnects per radio (transmitter/receiver) unit, thereby increasing the precision with which radio functions can be adjusted.

Accordingly, radio control signal bundles 334a-e enable a tight and precise low-latency real-time control of all radio settings of MIMO radio module 322. Furthermore, by using the same process technology for the various digital and analog components of wireless transceiver 300 and thereby eliminating inter-chip circuit lines (e.g., circuit lines 236a-b in wireless transceiver 200), several components can be eliminated. For example, driver-matching circuitry and voltage conversion circuitry are no longer needed. In addition, with a parallel radio control approach, de-multiplexing and latching circuitry (e.g., radio control de-multiplexer 230 and latches 244a-e) can also be eliminated. This reduction in components correspondingly results in a reduced cost and power consumption transceiver design.

The wireless IEEE 802.11n standard describes MIMO systems up to four spatial streams. According to embodiments of the present invention, the number of supported transmitter and receiver units may vary as well as the number of baseband signals supported between the DSP and the radio blocks. This depends on the modes of operation according to the standard that are supported by the particular embodiment. For instance, the number of transmitter units can be two and the number of receiver units can be three. This is referred to as a 2×3 embodiment. Other embodiments may be possible including, for example, 2×1, 1×2, 2×2, 2×4, 3×2, 3×3, 3×4, 4×2, 4×3, 4×4, etc.

Furthermore, the integration of the DSP and the radio modules onto the same substrate allows the radio to more effectively transport heat away from sensitive analog components, thereby increasing signal quality. For example, circuit material such as CMOS have a higher heat conductivity than air.

Therefore, heat generated in the radio module can readily travel to other, non-radio components (e.g., DSP, Host interface, etc.) on the integrated transceiver, thereby increasing the effective area for radio heat drain-off.

Figure 4:
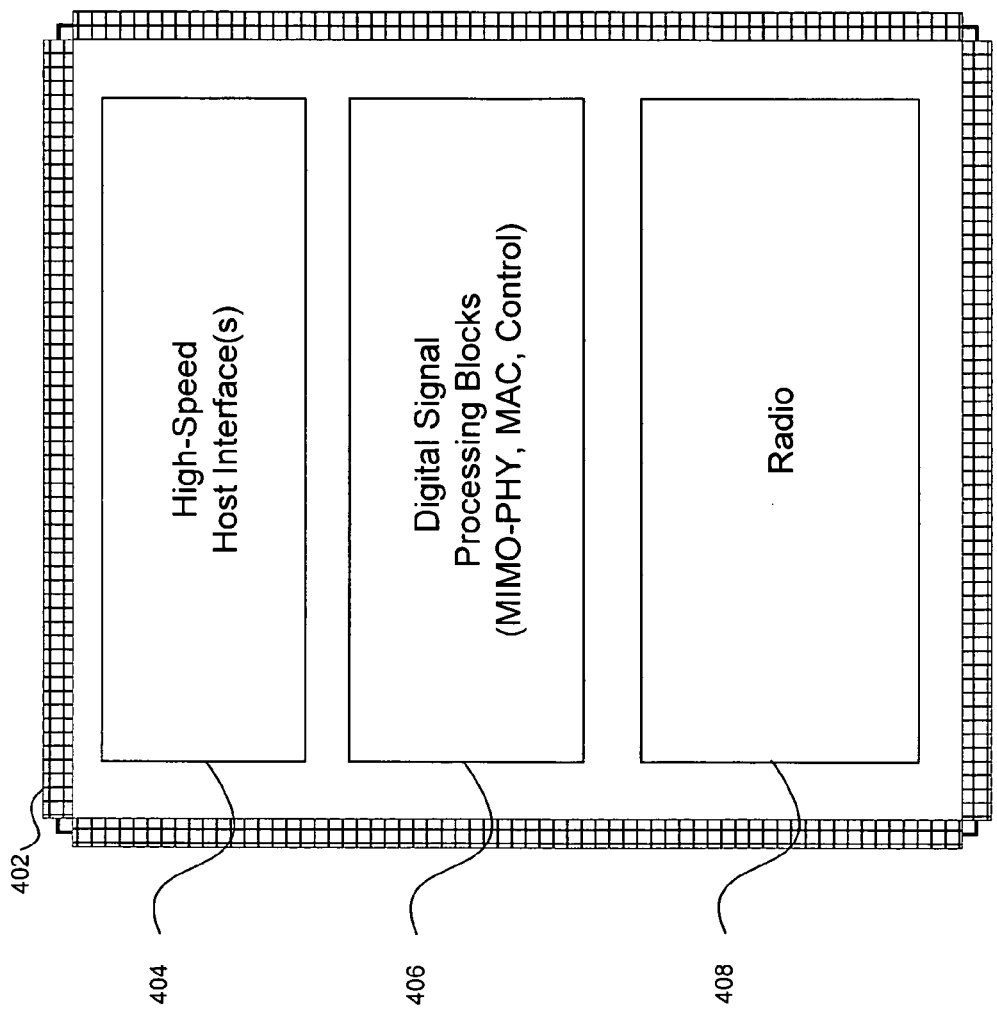
FIG. 4 illustrates a single-chip wireless transceiver.

FIG. 4 illustrates a single-chip wireless transceiver 400. Wireless transceiver 400 includes one or more High-speed Host Interfaces 404, one or more Digital Signal Processing (DSP) blocks 406, and a radio module 408, all integrated on a single die 402. In an embodiment, module 404 not only includes interfaces to external hosts, such as host processors located outside of the IC, but also includes one or more complete embedded (host) processors, such as an ARM (Advanced RISC Machine) processor with state-of-the-art peripheries and program memory. Such an embodiment is particularly useful for embedded applications, such as cell phones, small portable devices, or other devices not connected to a personal computer and having a host that is relied upon for processing of higher communication layers.

High-speed interfaces 404 may include host processor interfaces such as host processor interface 208. DSP blocks 406 may include digital modules such as MIMO DSP module 304 among others, including MIMO-PHY, MAC, and Control logic modules. Radio module 408 may include analog modules such as MIMO radio module 322 of wireless transceiver 300.

In an embodiment, DSP blocks 406 are positioned between high-speed interfaces 404 and radio module 408. As such, a maximum or near maximum distance is provided between the analog components of radio module 408 and the high-speed digital components of high-speed interfaces 404. In another embodiment, high-speed interfaces 404, DSP blocks 406, and radio module 408 are positioned to minimize the lengths of signal interconnects between DSP blocks 406 and radio module 408. In a further embodiment, high-speed interfaces 404, DSP blocks 406, and radio module 408 are positioned to increase the effective heat drain-off area of the radio module.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An integrated circuit (IC), comprising:
   a multiple-input-multiple-output (MIMO) radio module, including a plurality of transmitter and receiver units;
   a MIMO digital signal processing (DSP) module;
   a host processor interface that interfaces between said MIMO DSP module and a host processor; and
   a plurality of radio control signal bundles that connect said MIMO DSP module and said MIMO radio module, said plurality of radio control signal bundles including,
   a plurality of transmit radio control signal bundles, each of said transmit radio control signal bundles dedicated to a respective transmitter unit of said MIMO radio module and comprising transmit control signal lines, wherein said respective transmitter unit includes a first plurality of stages including a frequency-up conversion stage and a first gain amplification stage, and wherein each of said transmit control signal lines is dedicated to control a respective stage of the first plurality of stages of said respective transmitter unit;
   a plurality of receive radio control signal bundles, each of said receive radio control signal bundles dedicated to a respective receiver unit of said MIMO radio module and comprising receive control signal lines, wherein said respective receiver unit includes a second plurality of stages including a frequency down-conversion stage and a second gain amplification stage, and wherein each of said receive control signal lines is dedicated to control a respective stage of the second plurality of stages of said respective receiver unit;
   wherein said transmit and receive control signal lines enable said MIMO DSP module to control simultaneously any number of said first plurality of stages and second plurality of stages of said respective transmitter and receiver units.

2. The IC of claim 1, wherein said MIMO DSP module comprises a MIMO Transmit module to generate and transmit a plurality of transmit data signals to respective ones of said transmitter units of said MIMO radio module.

3. The IC of claim 1, wherein said MIMO DSP module comprises a MIMO Receive module to receive a plurality of receive data signals from respective ones of said receiver units of said MIMO radio module.

4. The IC of claim 2, further comprising a plurality of digital-to-analog converters (DACs) coupled between said MIMO Transmit module and said respective ones of said transmitter units.

5. The IC of claim 3, further comprising a plurality of analog-to-digital converters (ADCs) coupled between said MIMO Receive module and said respective ones of said receiver units.

6. The IC of claim 1, wherein each of said respective transmitter unit further comprises at least one of one or more variable bandwidth filtering stages; and circuitry to selectively enable/disable said frequency up-conversion, amplification, and filtering stages, and
   wherein said respective receiver unit further comprises at least one of one or more variable bandwidth filtering stages; and circuitry to selectively enable/disable said frequency down-conversion, amplification, and filtering stages.

7. The IC of claim 6, further comprising a synthesizer module to generate and provide frequency conversion signals to said frequency up-conversion stages and frequency down-conversion stages.

8. The IC of claim 1, wherein said MIMO radio module and said MIMO DSP module are implemented using the same process technology.

9. The IC of claim 1, wherein the IC comprises CMOS technology.

10. The IC of claim 1, wherein said MIMO DSP module is positioned between said MIMO radio module and said host processor interface.

11. The IC of claim 1, wherein said MIMO radio module, said MIMO DSP module, and said host processor interface are positioned to provide a maximum or near maximum distance between analog components of said MIMO radio module and high-speed digital components of said host processor interface.

12. The IC of claim 1, wherein said MIMO radio module, said MIMO DSP module, and said host processor interface are positioned to minimize lengths of signal interconnects that carry said plurality of radio control signal bundles.

13. The IC of claim 1, wherein said MIMO radio module, said MIMO DSP module, and said host processor interface are positioned to increase effective heat drain-off area of said MIMO radio module.

14. The IC of claim 1, wherein each of said transmitter units comprises an integrated power amplifier (PA).

15. The IC of claim 1, wherein said plurality of radio control signal bundles enable real-time control of said plurality of transmitter and receiver units of said MIMO radio module.

16. The IC of claim 1, wherein said plurality of radio control signal bundles are provided over direct parallel interconnects between said MIMO DSP module and said MIMO radio module.

17. The IC of claim 1, wherein said plurality of radio control signal bundles are provided over separate interconnects between said MIMO DSP module and said MIMO radio module.

18. The IC of claim 1, wherein each of said transceiver units comprises an integrated transmit/receive (T/R) switch.

19. The IC of claim 1, wherein each of said transceiver units comprises an integrated diplexer.

20. The IC of claim 1, wherein said radio module is a single-band radio.

21. The 1C of claim 1, wherein said radio module is a dual-band radio.

22. The IC of claim 1, wherein the number of transmitter units and corresponding radio control signal bundles is two, and the number of receiver units and corresponding radio control signal bundles is one.

23. The IC of claim 1, wherein the number of transmitter units and corresponding radio control signal bundles is one, and the number of receiver units and corresponding radio control signal bundles is two.

24. The IC of claim 1, wherein the number of transmitter units and corresponding radio control signal bundles is two, and the number of receiver units and corresponding radio signal control bundles is two.

25. The IC of claim 1, wherein the number of transmitter units and corresponding radio control signal bundles is two, and the number of receiver units and corresponding radio control signal bundles is three.

26. The IC of claim 1, wherein the number of transmitter units and corresponding radio control signal bundles is three, and the number of receiver units and corresponding radio control signal bundles is three.

27. The IC of claim 1, wherein the number of transmitter units and corresponding radio control signal bundles is three, and the number of receiver units and corresponding radio control signal bundles is four.

28. The IC of claim 1, wherein the number of transmitter units and corresponding radio control signal bundles is four, and the number of receiver units and corresponding radio control signal bundles is four.

29. The IC of claim 1, wherein the number of transmitter units and corresponding radio control signal bundles is four, and the number of receiver units and corresponding radio control signal bundles is two.

30. The IC of claim 1, wherein the number of transmitter units and corresponding radio control signal bundles is four, and the number of receiver units and corresponding radio control signal bundles is three.

31. The IC of claim 1, wherein said MIMO DSP module comprises a control logic module that drives said plurality of radio control signal bundles.

32. An integrated circuit (IC), comprising:
a multiple-input-multiple-Output (MIMO) radio module, including a plurality of transmitter and receiver units, a MIMO digital signal processing (DSP) module;
an embedded host processor, coupled to said MIMO DSP module; and
a plurality of radio control signal bundles that connect said MIMO DSP module and said MIMO radio module, said plurality of radio control signal bundles including,
a plurality of transmit radio control signal bundles, each of said transmit radio control signal bundles dedicated to a respective transmitter unit of said MIMO radio module and comprising transmit control signal lines, wherein said respective transmitter unit includes a first plurality of stages, including a frequency-up conversion stage and a first gain amplification stage, and wherein each of said transmit control signal lines is dedicated to control a respective stage of the first plurality of stages of said respective transmitter unit;
a plurality of receive radio control signal bundles, each of said receive radio control signal bundles dedicated to a respective receiver unit of said MIMO radio module and comprising receive control signal lines, wherein said respective receiver unit includes a second plurality of stages including a frequency down-conversion stage and a second gain amplification stage, and wherein each of said receive control signal lines is dedicated to control a respective stage of the second plurality of stages of said respective receiver unit;
wherein said transmit and receive control signal lines enable said MIMO DSP module to control simultaneously any number of said first plurality of stages and second plurality of stages of said plurality of respective transmitter and receiver units.

33. An integrated circuit (IC), comprising:
a multiple-input-multiple-output (MIMO) radio module, including a plurality of transmitter units;
a MIMO digital signal processing (DSP) module;
a host processor interface that interfaces between said MIMO DSP module and a host processor; and
a plurality of radio control signal bundles that connect said MIMO DSP module and said MIMO radio module, said plurality of radio control signal bundles including, a plurality of transmit radio control signal bundles, each of said transmit radio control signal bundles dedicated to a respective transmitter unit of said MIMO radio module and comprising transmit control signal lines, wherein said respective transmitter unit includes a plurality of stages, including a frequency-up conversion stage and a first gain amplification stage, and wherein each of said transmit control signal lines is dedicated to control a respective stage of the plurality of stages of said respective transmitter unit;
wherein said transmit control signal lines enable said MIMO DSP module to control simultaneously any number of said plurality stages of said respective transmitter unit.

* * * * *

UNITED STATES PATENT AND TRADEMARK OFFICE
CERTIFICATE OF CORRECTION

PATENT NO. : 8,369,388 B2  
APPLICATION NO. : 12/004406  
DATED : February 5, 2013  
INVENTOR(S) : Joachim S. Hammerschmidt Page 1 of 1

It is certified that error appears in the above-identified patent and that said Letters Patent is hereby corrected as shown below:

In the Claims:

Column 9, Line 25, "1C" should be replaced with --IC--.

Column 10, Line 5, "Output" should be replaced with --output--.

Signed and Sealed this  
Twenty-third Day of April, 2013

Teresa Stanek Rea  
*Acting Director of the United States Patent and Trademark Office*